United States Patent [19]
Bertness

[11] Patent Number: 5,945,829
[45] Date of Patent: Aug. 31, 1999

[54] MIDPOINT BATTERY MONITORING

[75] Inventor: Kevin I. Bertness, Batavia, Ill.

[73] Assignee: Midtronics, Inc., Burr Ridge, Ill.

[21] Appl. No.: 08/943,033

[22] Filed: Oct. 2, 1997

Related U.S. Application Data

[60] Provisional application No. 60/027,890, Oct. 7, 1996.

[51] Int. Cl.$^6$ .................................................. G01N 27/46
[52] U.S. Cl. ...................... 324/430; 324/434; 324/433; 320/48; 340/636
[58] Field of Search .............................. 320/48; 340/636; 324/430, 433, 434

[56] References Cited

U.S. PATENT DOCUMENTS

| | | |
|---|---|---|
| 3,873,911 | 3/1975 | Champlin . |
| 3,909,708 | 9/1975 | Champlin . |
| 4,053,824 | 10/1977 | Dupuis .................................... 320/48 |
| 4,316,185 | 2/1982 | Watrous ................................. 324/433 |
| 4,363,407 | 12/1982 | Barkler et al. . |
| 4,424,491 | 1/1984 | Bobbett et al. . |
| 4,697,134 | 9/1987 | Burkum ................................. 324/430 |
| 4,816,768 | 3/1989 | Champlin . |
| 4,825,170 | 4/1989 | Champlin . |
| 4,881,038 | 11/1989 | Champlin . |
| 4,912,416 | 3/1990 | Champlin . |
| 4,931,738 | 6/1990 | MacIntyre et al. . |
| 5,047,722 | 9/1991 | Wurst ..................................... 324/430 |
| 5,140,269 | 8/1992 | Champlin . |
| 5,170,124 | 12/1992 | Blair et al. . |
| 5,281,920 | 1/1994 | Wurst ..................................... 324/430 |
| 5,302,902 | 4/1994 | Groehl . |
| 5,561,380 | 10/1996 | Sway-Tin et al. . |
| 5,652,501 | 7/1997 | McClure et al. . |
| 5,675,234 | 10/1997 | Greene . |
| 5,677,077 | 10/1997 | Faulk . |

*Primary Examiner*—Josie Ballato
*Assistant Examiner*—Jose M. Solis
*Attorney, Agent, or Firm*—Westman, Champlin & Kelly, P.A.

[57] ABSTRACT

A device for testing a battery includes circuitry adapted to measure a first conductance of a first portion of a string of cells that makes up the battery. Further circuitry is adapted to measure a second conductance of a second portion of the string of cells that makes up the battery. Comparison circuitry compares the first conductance and the second conductance and provides an output based upon the comparison which is related to a condition of the battery.

9 Claims, 14 Drawing Sheets

Fig. 1-1

STRING 1

| CELL # | FLOAT VOLTAGE | COND. KM HOS | % CAP. |
|---|---|---|---|
| 1 | 2.23 | 2.44 | 53.9 |
| 2 | 2.23 | 2.09 | 15.4 |
| 3 | 2.23 | 2.18 | 24.3 |
| 4 | 2.22 | 2.14 | 15.4 |
| 5 | 2.22 | 2.44 | 40.6 |
| 6 | 2.23 | 2.52 | 41.0 |
| 7 | 2.23 | 1.98 | 3.2 |
| 8 | 2.23 | 2.65 | 68.4 |
| 9 | 2.23 | 1.85 | 0.8 |
| 10 | 2.23 | 2.29 | 32.9 |
| 11 | 2.23 | 2.27 | 27.0 |
| 12 | 2.24 | 2.09 | 21.5 |
| 13 | 2.24 | 1.86 | 7.6 |
| 14 | 2.23 | 2.39 | 53.9 |
| 15 | 2.23 | 2.24 | 32.5 |
| 16 | 2.22 | 2.39 | 76.6 |
| 17 | 2.22 | 1.99 | 6.1 |
| 18 | 2.23 | 2.50 | 72.6 |
| 19 | 2.23 | 2.83 | 68.5 |
| 20 | 2.22 | 2.92 | 68.4 |
| 21 | 2.22 | 2.67 | 61.7 |
| 22 | 2.22 | 2.20 | 23.7 |
| 23 | 2.22 | 2.04 | 8.6 |
| 24 | 2.23 | 2.42 | 51.8 |

STRING 2

| CELL # | FLOAT VOLTAGE | COND. KM HOS | % CAP. |
|---|---|---|---|
| 1 | 2.23 | 2.13 | 9.9 |
| 2 | 2.23 | 2.39 | 30.8 |
| 3 | 2.22 | 2.43 | 25.7 |
| 4 | 2.35 | 2.01 | 0.1 |
| 5 | 2.23 | 2.45 | 36.2 |
| 6 | 2.22 | 2.48 | 42.0 |
| 7 | 2.23 | 2.53 | 49.2 |
| 8 | 2.22 | 2.18 | 0.5 |
| 9 | 2.23 | 1.02 | 0.0 |
| 10 | 2.23 | 1.83 | 1.0 |
| 11 | 2.22 | 1.95 | 1.0 |
| 12 | 2.22 | 2.39 | 34.8 |
| 13 | 2.22 | 1.99 | 0.1 |
| 14 | 2.23 | 2.07 | 0.9 |
| 15 | 2.22 | 2.13 | 8.2 |
| 16 | 2.24 | 3.40 | 100.0 |
| 17 | 2.23 | 2.61 | 41.3 |
| 18 | 2.24 | 2.88 | 77.4 |
| 19 | 2.22 | 2.14 | 9.9 |
| 20 | 2.23 | 2.67 | 58.8 |
| 21 | 2.23 | 2.04 | 0.1 |
| 22 | 2.24 | 2.50 | 30.0 |
| 23 | 2.23 | 2.43 | 28.5 |
| 24 | 2.24 | 2.77 | 53.6 |

Fig 1-2

STRING 3

| CELL # | FLOAT VOLTAGE | COND. KM HOS | % CAP. |
|---|---|---|---|
| 1 | 2.25 | 2.83 | 87.2 |
| 2 | 2.25 | 2.09 | 15.4 |
| 3 | 2.24 | 2.56 | 69.6 |
| 4 | 2.24 | 2.15 | 44.1 |
| 5 | 2.25 | 2.34 | 44.8 |
| 6 | 2.25 | 2.03 | 25.5 |
| 7 | 2.26 | 2.29 | 28.3 |
| 8 | 2.25 | 1.57 | 0.3 |
| 9 | 2.25 | 1.80 | 0.8 |
| 10 | 2.24 | 2.17 | 35.2 |
| 11 | 2.28 | 1.13 | 0.1 |
| 12 | 2.25 | 1.98 | 13.9 |
| 13 | 2.26 | 1.88 | 3.0 |
| 14 | 2.25 | 2.52 | 71.3 |
| 15 | 2.26 | 2.02 | 25.1 |
| 16 | 2.25 | 1.64 | 0.3 |
| 17 | 2.26 | 2.02 | 9.5 |
| 18 | 2.25 | 1.78 | 1.0 |
| 19 | 2.25 | 2.10 | 14.5 |
| 20 | 2.25 | 1.86 | 1.3 |
| 21 | 2.26 | 2.31 | 40.0 |
| 22 | 2.26 | 2.30 | 42.9 |
| 23 | 2.26 | 2.25 | 47.0 |
| 24 | 2.26 | 2.46 | 65.7 |

STRING 4

| CELL # | FLOAT VOLTAGE | COND. KM HOS | % CAP. |
|---|---|---|---|
| 1 | 2.26 | 2.01 | 29.9 |
| 2 | 2.26 | 2.41 | 64.5 |
| 3 | 2.26 | 1.87 | 5.1 |
| 4 | 2.26 | 2.05 | 32.2 |
| 5 | 2.25 | 2.10 | 14.6 |
| 6 | 2.26 | 2.34 | 59.2 |
| 7 | 2.25 | 2.64 | 70.5 |
| 8 | 2.25 | 2.86 | 74.3 |
| 9 | 2.26 | 2.80 | 68.7 |
| 10 | 2.25 | 2.90 | 77.8 |
| 11 | 2.25 | 2.70 | 93.5 |
| 12 | 2.26 | 2.87 | 88.0 |
| 13 | 2.24 | 3.09 | 78.9 |
| 14 | 2.26 | 2.84 | 84.6 |
| 15 | 2.25 | 2.86 | 99.5 |
| 16 | 2.24 | 3.16 | 98.5 |
| 17 | 2.25 | 2.79 | 80.2 |
| 18 | 2.26 | 1.39 | 43.8 |
| 19 | 2.26 | 1.75 | 0.8 |
| 20 | 2.25 | 2.48 | 64.4 |
| 21 | 2.25 | 2.26 | 34.0 |
| 22 | 2.27 | 1.89 | 3.5 |
| 23 | 2.26 | 1.99 | 25.7 |
| 24 | 2.27 | 1.97 | 22.8 |

Fig. 1-3

STRING 5

| CELL # | FLOAT VOLTAGE | COND. KM HOS | % CAP. |
|---|---|---|---|
| 1 | 2.25 | 3.08 | 94.4 |
| 2 | 2.27 | 3.49 | 114.2 |
| 3 | 2.25 | 2.63 | 73.6 |
| 4 | 2.27 | 2.30 | 32.5 |
| 5 | 2.25 | 2.87 | 76.8 |
| 6 | 2.26 | 2.59 | 72.3 |
| 7 | 2.24 | 2.17 | 31.6 |
| 8 | 2.24 | 2.59 | 54.0 |
| 9 | 2.25 | 2.94 | 87.0 |
| 10 | 2.27 | 2.42 | 52.1 |
| 11 | 2.26 | 1.56 | 70.2 |
| 12 | 2.27 | 2.54 | 73.2 |
| 13 | 2.26 | 2.79 | 91.1 |
| 14 | 2.26 | 2.51 | 66.8 |
| 15 | 2.26 | 2.56 | 55.6 |
| 16 | 2.26 | 2.30 | 39.7 |
| 17 | 2.25 | 2.54 | 59.6 |
| 18 | 2.26 | 1.52 | 43.6 |
| 19 | 2.26 | 2.33 | 63.3 |
| 20 | 2.26 | 2.34 | 63.6 |
| 21 | 2.25 | 2.85 | 85.2 |
| 22 | 2.26 | 1.28 | 36.6 |
| 23 | 2.24 | 2.37 | 52.2 |
| 24 | 2.26 | 1.18 | 108.4 |

STRING 5 CONFIGURED

| CELL # | FLOAT VOLTAGE | COND. KM HOS | % CAP. |
|---|---|---|---|
| 1 | 2.25 | 3.08 | 94.4 |
| 2 | 2.27 | 3.49 | 114.2 |
| 3 | 2.25 | 2.63 | 73.6 |
| 5 | 2.25 | 2.87 | 76.8 |
| 6 | 2.26 | 2.59 | 72.3 |
| 9 | 2.25 | 2.94 | 87.9 |
| 11 | 2.26 | 2.56 | 70.2 |
| 12 | 2.27 | 2.54 | 73.2 |
| 13 | 2.26 | 2.79 | 91.1 |
| 14 | 2.26 | 2.51 | 68.8 |
| 21 | 2.25 | 2.85 | 85.1 |
| 24 | 2.26 | 2.18 | 104.4 |
| 4 | 2.27 | 2.30 | 32.5 |
| 7 | 2.24 | 2.17 | 31.6 |
| 8 | 2.24 | 2.59 | 54.0 |
| 10 | 2.27 | 2.42 | 52.1 |
| 15 | 2.26 | 2.56 | 55.6 |
| 16 | 2.26 | 2.30 | 39.7 |
| 17 | 2.25 | 2.54 | 59.6 |
| 18 | 2.26 | 2.52 | 43.6 |
| 19 | 2.26 | 2.33 | 63.3 |
| 20 | 2.26 | 2.34 | 63.6 |
| 22 | 2.26 | 2.28 | 36.6 |
| 23 | 2.24 | 2.37 | 52.2 |

MIDPOINT VOLTAGE AND MIDPOINT CAPACITY DATA

| | STRING 1 | STRING 2 | STRING 3 | STRING 4 | STRING 5 | STRING 5 (RECONFIG) |
|---|---|---|---|---|---|---|
| VOLTAGE 1-12 | 26.806 | 26.880 | 27.010 | 27.070 | 27.080 | 27.090 |
| VOLTAGE 13-24 | 26.758 | 26.810 | 27.070 | 27.060 | 27.080 | 27.070 |
| MIDPOINT VOLTAGE DIFFERENCE | -0.048 | -0.070 | 0.060 | -0.010 | 0.000 | -0.020 |
| MIDPOINT VOLTAGE RATIO | 0.998 | 0.997 | 1.002 | 0.999 | 1.000 | 0.999 |
| % CAPACITY 1-12 | 28.7% | 19.1% | 30.4% | 56.7% | 69.4% | 84.3% |
| % CAPACITY 13-24 | 39.6% | 34.1% | 26.8% | 53.2% | 63.9% | 48.7% |
| MIDPOINT CAPACITY DIFFERENCE | 10.9% | 15.0% | -3.6% | -3.5% | -5.5% | -35.6% |
| MIDPOINT CAPACITY RATIO | 1.380 | 1.790 | 0.882 | 0.940 | 0.920 | 0.578 |

MIDPOINT CONDUCTANCE AND MIDPOINT CAPACITY DATA

|  | STRING 1 | STRING 2 | STRING 3 | STRING 4 | STRING 5 | STRING 5 (RECONFIG) |
|---|---|---|---|---|---|---|
| CONDUCTANCE(KMHOS) 1-12 | 2.222 | 2.026 | 1.971 | 2.471 | 2.640 | 2.801 |
| CONDUCTANCE(KMHOS) 13-24 | 2.329 | 2.407 | 2.061 | 2.365 | 2.523 | 2.386 |
| MIDPOINT CONDUCTANCE DIFFERENCE | 0.107 | 0.381 | 0.090 | -0.106 | -0.117 | -0.415 |
| MIDPOINT CONDUCTANCE RATIO | 1.048 | 1.188 | 1.050 | 0.957 | 0.956 | 0.852 |
| % CAPACITY 1-12 | 28.7% | 19.1% | 30.4% | 56.7% | 69.4% | 84.3% |
| % CAPACITY 13-24 | 39.6% | 34.1% | 26.8% | 53.2% | 63.9% | 48.7% |
| MIDPOINT CAPACITY DIFFERENCE | 10.9% | 15.0% | -3.6% | -3.5% | -5.5% | -35.6% |
| MIDPOINT CAPACITY RATIO | 1.380 | 1.790 | 0.882 | 0.940 | 0.920 | 0.578 |

Fig. 10

|  | #BAD MISSED | %BAD MISSED | %BAD FOUND | #GOOD MISSED | %GOOD MISSED | %GOOD FOUND | OVERALL INACCURACY | OVERALL ACCURACY |
|---|---|---|---|---|---|---|---|---|
| SINGLE CELL | 2 | 1.7% | 98.3% | 8 | 6.7% | 93.3% | 8.3% | 91.7% |
| 3 CELL | 4 | 3.3% | 96.7% | 9 | 7.5% | 92.5% | 10.8% | 89.2% |
| 6 CELL | 0 | 0.0% | 100.0% | 14 | 11.7% | 88.3% | 11.7% | 88.3% |
| 12 CELL | 0 | 0.0% | 100.0% | 14 | 11.7% | 88.3% | 11.7% | 88.3% |

MIDPOINT BATTERY MONITORING

This application is based on Provisional Application Serial No. 60/027,890, filed on Oct. 7, 1996.

BACKGROUND OF THE INVENTION

The present invention relates to battery testers. More specifically, the present invention relates to a technique for determining a parameter related to operation and condition of a battery.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin for testing storage batteries by measuring the conductance of the batteries. This technique is described in a number of United States patents obtained by Dr. Champlin, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; and U.S. Pat. No. 5,140,269, issued Aug. 18, 1992, to Champlin, entitled ELECTRONIC TESTER FOR ASSESSING BATTERY/CELL CAPACITY.

Generally, in order to evaluate the condition of a battery, some type of reference must be used with which to compare the measured parameter. Developing an accurate standard is a time-consuming process which must be performed on each type of battery which will be tested. Generally, the results of a battery test are only as accurate as the reference standard being used.

SUMMARY OF THE INVENTION

A device for testing a battery of the type which consists of a string of individual cells includes circuitry adapted to measure a first parameter of a first portion of the string of individual cells that make up the battery. Additional circuitry is adapted to measure a second parameter of a second portion of the string of individual cells that makes up the battery. Comparison circuitry compares the first and second parameters and responsively provides an output based upon the comparison. The output is related to the condition of the battery. In preferred embodiments, the first and second parameters are electrical conductance of the respective first and second portions.

BRIEF DESCRIPTION OF THE DRAWINGS

FIG. 1 is a table of voltage, conductance and capacity values for cells of various strings in a battery.

FIG. 3 is a graph of midpoint capacity difference versus midpoint voltage.

DETAILED DESCRIPTION OF THE PREFERRED EMBODIMENTS

The present invention solves prior art problems associated with setting standards, obtaining a standard and maintaining the accuracy of the standard.

In many battery installations such as Telcos, (telephone companies), a cost-effective battery system management is high priority. While a regular battery management program will ultimately reduce down time, improve customer service and system quality, programs to add capital equipment can only be justified if a reduction in costs can be expected through improved priority management or because of added value associated with more reliable service. There is an ongoing search for more cost effective-solutions which will help to optimize the management of battery replacement.

Various techniques have been used, including midpoint voltage monitoring techniques and stationary monitoring systems using conductance measuring techniques on a single cell, multicell or midpoint basis.

In order to evaluate the accuracy and utility of several monitoring techniques, this description uses actual test data on five-48v strings of 1000 AH VRLA AGM cells, from a telecom transmission office. The cells were approximately 5 to 6 years old, in full float service, when tested. The data available includes individual cell float voltages, individual cell conductance measurements and complete discharge data on each of the 120 cells which were discharged at the two hour rate to 1.88 volts per cell. The data used for each string in the following analysis is shown in the tables of FIG. 1.

The present invention provides a new technique for establishing a reference for use in a battery test. In some types of battery installations, a number of battery cells are connected in a series string with electrical connections on either end of the series string, as well as at least one electrical connection between the ends of the string. The present invention recognizes that a battery can be monitored by comparing test parameters measured between different points in the same series of batteries. In one embodiment, the battery test is performed between one end of the string and a midpoint, and between the other end of the string and the midpoint, and the results of the two tests are compared. Thus, instead of using an absolute standard for a given battery, the present invention uses a relative standard and compares one portion of the series string to another portion of the series string.

First a midpoint voltage (MPV) technique can be evaluated for accuracy. The 24 cell string is measured in two sections, cells 1 to 12 and cells 13–24. The total voltages of each half are compared and if they differ by more than a previously determined amount, the MPV monitoring systems are intended to indicate possible difficulty and/or provide an alarm. It can be demonstrated that in strings in which cell capacity results varied from 0% to 100%, all float voltages were within the manufacturer's recommended acceptable float voltage tolerances.

Figure 2:
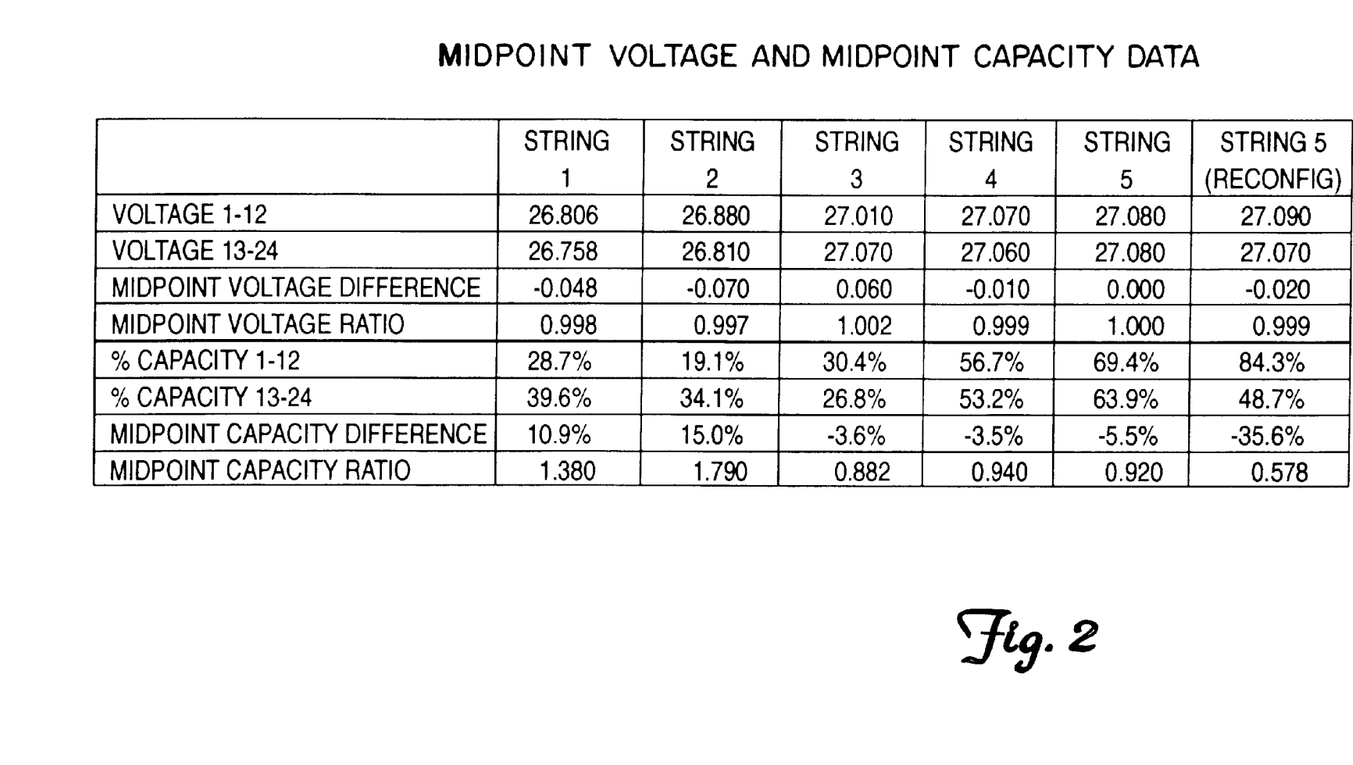
FIG. 2 is a table of string parameters for various strings of a battery.

For the five strings involved in this analysis, FIG. 2 shows the 12 cell float voltage totals for cells 1 to 12 vs. 13 to 24; the voltage differences, cells 13 to 24 minus cells 1 to 12; the ratios of totals, cells 13 to 24/cells 1 to 12, and similar data for the measured capacity values for each half string. As an additional exercise, to test the sensitivity and accuracy of the midpoint float voltage and other techniques, the cells were rearranged in string 5, putting all the high capacity cells in the 1 to 12 cell group and all the low capacity cells in the 13 to 24 cell group. This resulted in an average capacity of 84.3% for cells 1 to 12 vs. 48.7% for cells 13 to 24. The analysis which follows will include the results from this rearranged string.

Reviewing the midpoint voltage differences, it can be seen that they range from −0.07 volts to +0.06 volts, while capacity differences range from −35.6% to +10.9% of the manufacturer's published capacity. To get a better perspective, the capacity differences were plotted vs. the midpoint voltage differences shown in FIG. 3. A regression analysis indicates a correlation coefficient, $R^2=0.118$, i.e., essentially no correlation between midpoint voltage differences and midpoint capacity differences. Note that even in the rearranged string 5, where the capacity difference is (48.7% minus 84.3%) equal to −35.6%, the midpoint float voltage difference is only −0.02 volts (27.07–27.09).

Since these actual cell data does not support the effectiveness of midpoint voltage monitoring as a indicator of a capacity problems, it seemed worthwhile to consider some calculated scenarios in which it might be more applicable. Information from manufacturers and national and international standards suggest that once stabilized and floating properly, VRLA cell voltages may vary by ±2.5%. For a string floating at 2.25 volts per cell (VPC) average, this allows a variation of ±0.056 volts. Hence, cells could float as low as 2.19 volts and as high as 2.306 volts and still remain within acceptable limits. If we were to take a best (or worst) case example, putting all the low cells in 1 to 12 and all the high ones in 13 to 24, would result in (12×2.306= 27.672) minus (12×2.19=26.28). The MPV is 27.672 minus 26.28 which equals a 1.392 voltage difference between the two portions of the string. Since some users have considered a MPV differential of 1.0 volt as an alarm indicator, these results suggest that cells floating within the manufacturer's published tolerances could cause a false alarm.

It has been suggested that the MPV technique, while not useful in detecting capacity problems, could detect shorted cells. This is not necessarily true. In most actual situations, shorted cells float at approximately open circuit values for extended periods. For a 1.300 specific gravity (SG) absorbed glass mat VRLA cell, this means 2.15 volts, on float, would indicate a probable short. If one accepts the 1.0 volt midpoint voltage difference as appropriate for an alarm, it is a simple calculation to determine the number of shorted cells, which must all be in the same half of the string, to produce a one volt difference. For a string floating at 2.25 volts per cell average, 8 shorted cells at 2.15 volts, would have the remaining 16 cells at 2.30 volts. If all eight cells were in the 1 to 12 cell half, then the voltage of cells 1 to 12 would be 26.4 volts vs. the voltage of cells 13 to 24 at 27.6 volts, for MPV difference of 1.2 volts.

Ignoring the statistical improbability involved, note that the sensitivity of the midpoint voltage changes with the overall string float voltage. For a string floating at 2.27 volts, six shorted cells, at 2.15 volts per cell would produce a midpoint voltage difference of 0.96 volts. For a string floating at 2.35 volts per cell, four shorted cells would produce a voltage difference of 0.96 volts. Hence, the sensitivity to normal shorted cells of midpoint voltage is poor, requires multiple shorts in the same portion of the string and is a function of the overall string float voltage setting.

Another possibility is a shorted cell at the unusually low float voltage of 1.95 volts. This would result in a MPV difference of only 0.32 volts, for a single shorted cell. It would require 3 cells at 1.95 volts, all in the same group to produce a MPV difference of 1.03 volts. Since a 1.95 volt shorted cell is rare, three in the same group is highly unlikely. A much less likely condition is a shorted cell at 1.0 volts, which would result in a midpoint voltage difference of 1.29 volts and cause an alarm, but again with the 1.95 volt short, a 1.0 volt short is extremely unlikely. Some experts have proposed the possibility of an "ideal" short, i.e., a cell at zero volts. Here the calculation results in a midpoint voltage differential of 2.34 volts, well above alarm conditions, but so unlikely as to make its detection of no practical use.

The result of these analyses, both on real cells with both float voltage and actual capacity values and of hypothetical values in theoretical exercises, using difference values of voltages for shorted cells, all indicate that midpoint voltage is essentially useless as a fault detector, except in the most unlikely circumstances.

Midpoint voltage difference monitoring during discharge has also been proposed, with the expectation that the voltage of the lower capacity half, would deviate rapidly from the voltage of the stronger half. A MPV alarm target of ±0.5 volts as an indicator of low capacity and plotted MPV vs. discharge time was chosen. Testing shows a significant decrease in MPV as the discharge proceeded. However, careful analysis of their data shows that in all cases a significant percentage of overall discharge must occur (44% to 88%) before the MPV value reached the ±0.5 volts alarm point, thus causing doubt that the technique could provide definitive results with only a brief portion of the discharge required.

Figure 4:
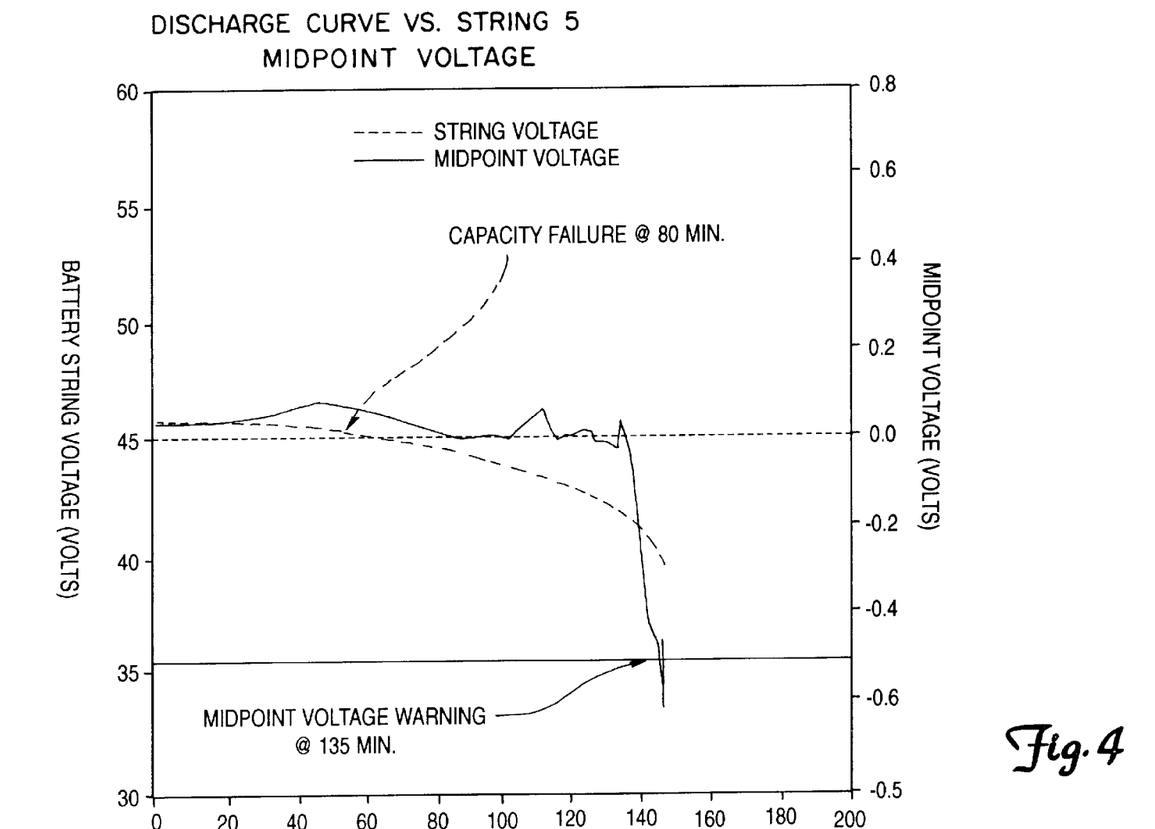
FIG. 4 is a graph of voltage versus time.

The data of string #5 have been utilized to produce the graph of FIG. 4. FIG. 4 shows the battery string voltage vs. time plot and the MPV difference vs. time. Note that the battery reached its 45.12 volt (1.88 VPC) cutoff voltage in only 80 minutes, i.e., 66% of rated capacity value. The MPV difference did not reach the intended ±0.5 volt alarm target until 135 minutes, 55 minutes after the string had already failed.

Figure 5:
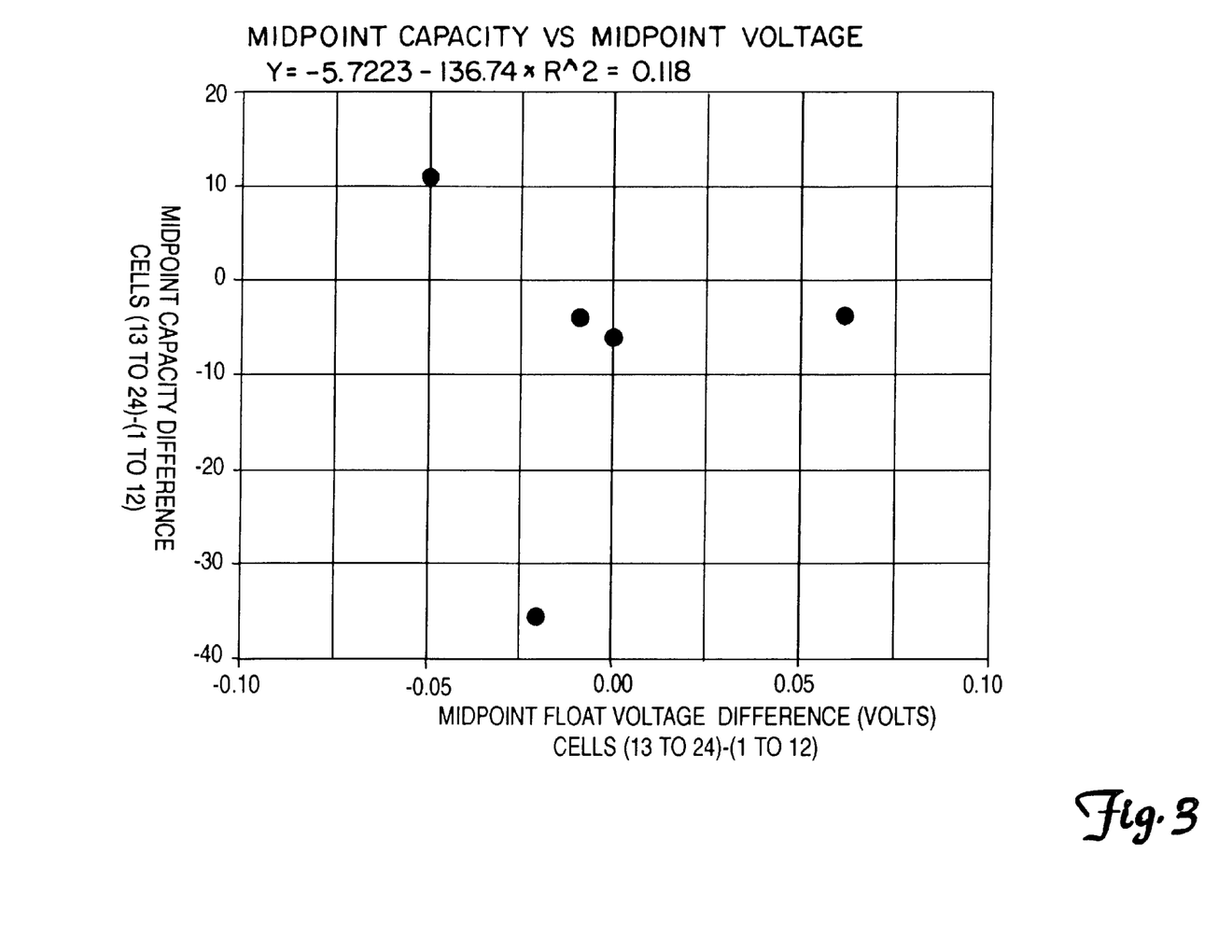
FIG. 5 is a graph of voltage versus time.

In order to test the discharge MPV technique under idealized conditions, the re-configured string #5 data was then plotted, as in FIG. 5. Despite the midpoint capacity difference of 84% vs. 48% between the two half strings, it still required 35 minutes of discharge time before the MPV value reached the ±0.5 volt MPV alarm target. This is 44% of the total discharge time, even under the most exaggerated capacity difference between the two halves of string #5. It is clear that a significant percentage of the discharge must be performed before the MPV alarm target is reached. This raises serious questions as to any time or cost savings which would result from the use of this technique as a battery monitoring device.

The present invention recognizes midpoint conductance monitoring as an accurate and cost effective alternative. One important criteria associated with deploying any battery monitoring system is to identify the demonstrated level of accuracy associated with the various testing techniques. Included herein are several models which suggest that a user can select from a wide variety of options available such as single or multiple cell on-line conductance monitoring as well as single or multiple cell on-line conductance testing using portable test equipment. The cost associated with the monitoring approach and the respective accuracy of each technique will be evaluated using conductance and capacity data for five strings shown in FIG. 1. In this assessment, individual cell conductance and capacity data are used to synthesize equivalent conductance for 3 cell, 6 cell, and 12 cell groups. The average capacity for these same equivalent cell groups are then used to assess and contrast the benefits of multiple cell monitoring.

Figure 6:
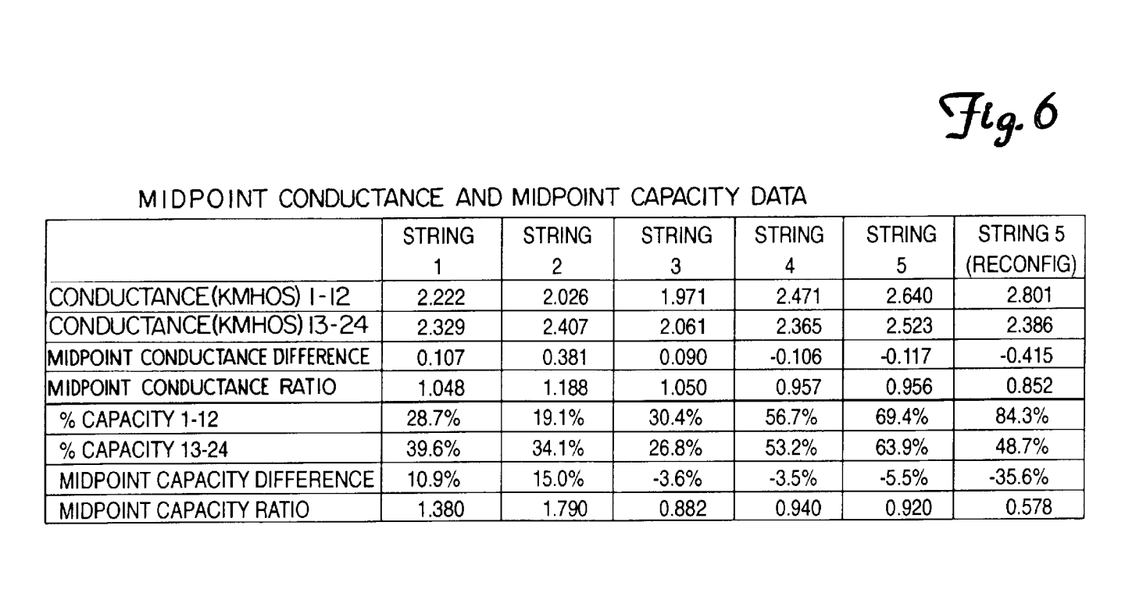
FIG. 6 is a table showing battery parameters or various strings of a battery.

The table of FIG. 6 lists the equivalent midpoint conductance values for cells 1 to 12 and cells 13 to 24 for the same five strings as in FIG. 1 as well as for the re-configured string #5. The table also lists the 12 cell conductance differences and conductance ratios. In addition, it lists the capacity differences and capacity ratios for each of the 12 cell groupings in each string.

Figure 7:
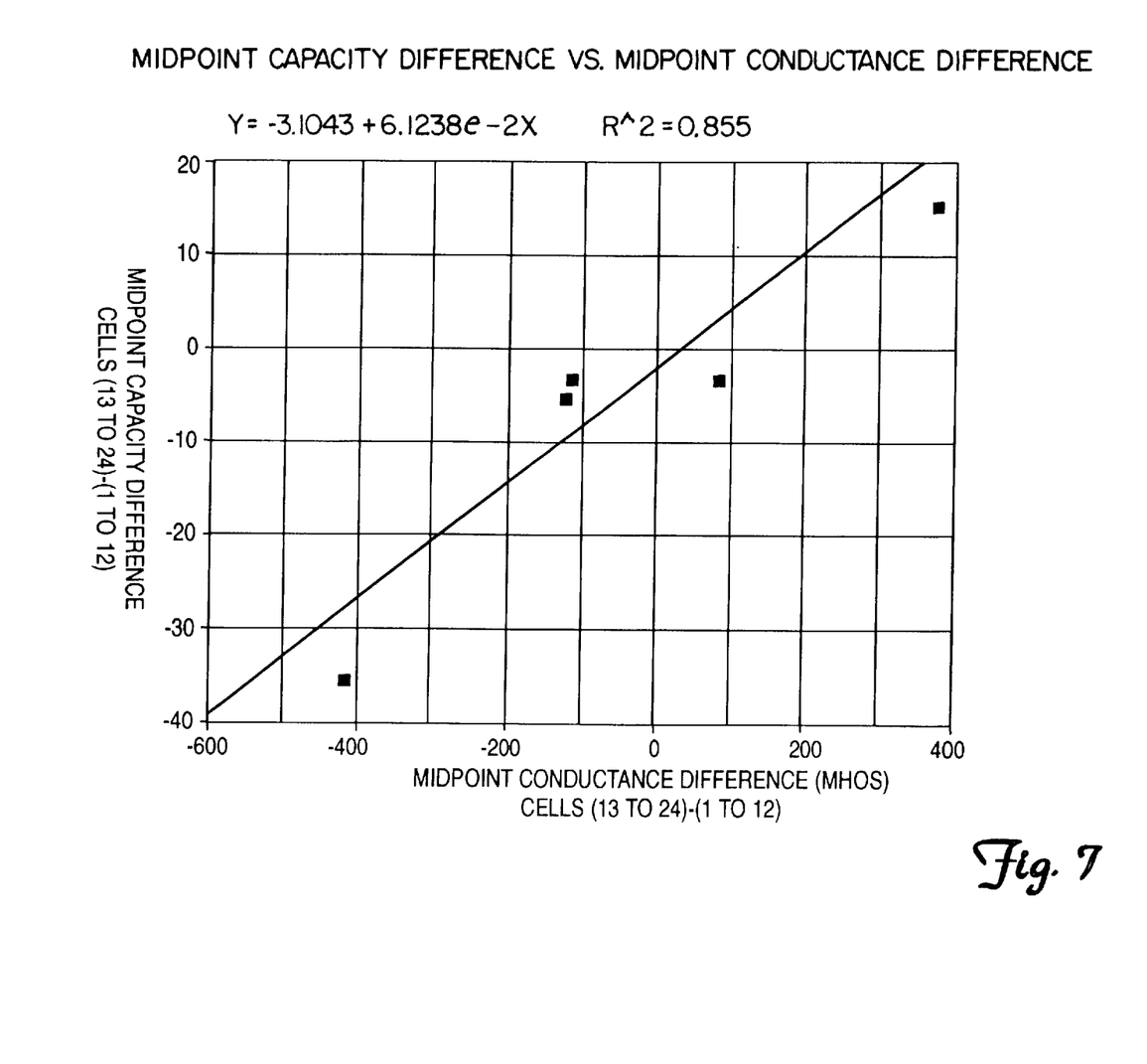
FIG. 7 is a graph of capacity difference versus conductance difference.
Figure 8:
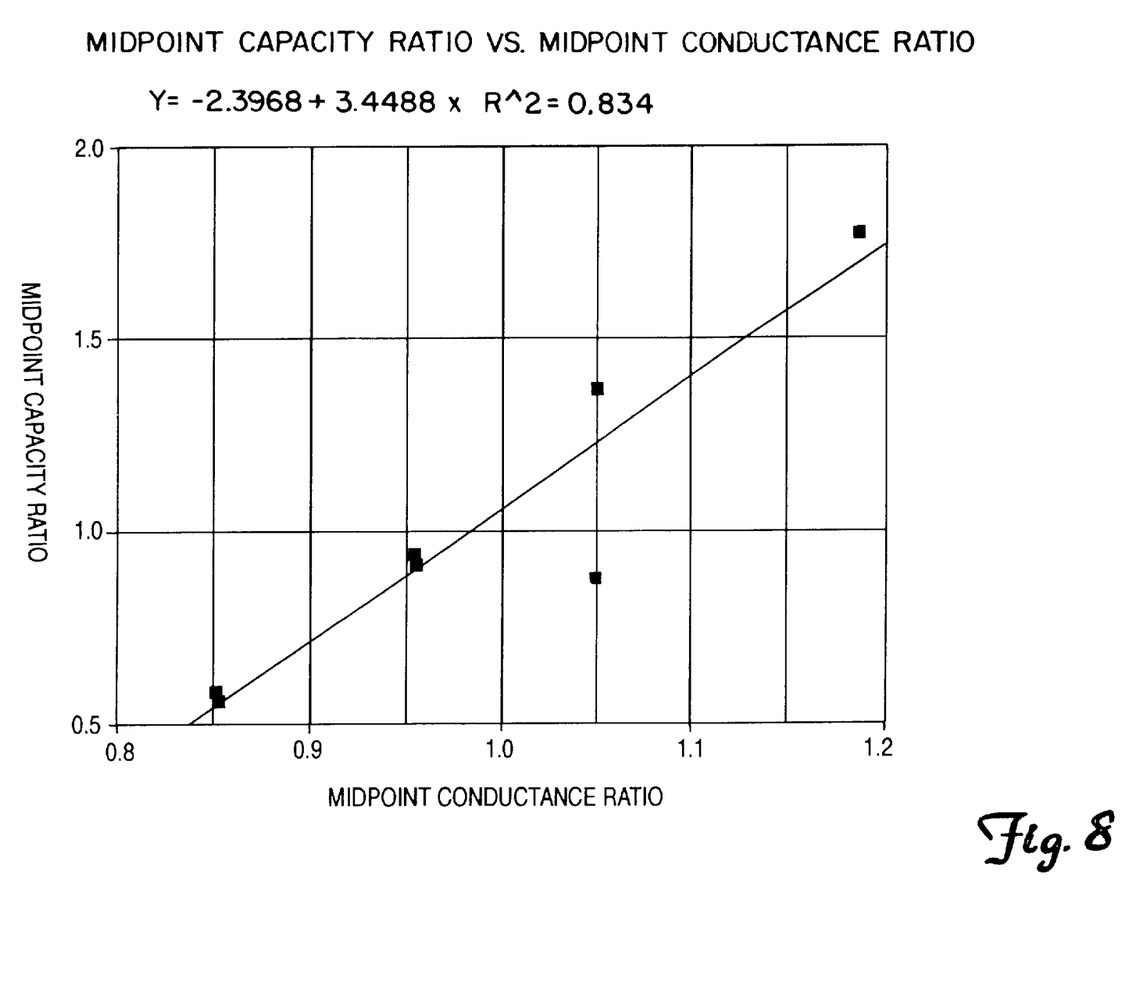
FIG. 8 is a graph of capacity ratio versus conductance ratio.

FIG. 7 shows a plot of midpoint capacity difference vs. midpoint conductance difference of all of the strings, including the re-configured string #5. The correlation coefficient $R^2=0.855$ indicates a strong correlation of midpoint capacity difference with midpoint conductance difference, especially when contrasted with the $R^2=0.118$ value of the equivalent capacity/MPV regression. FIG. 8 shows a plot and regression analysis of midpoint capacity ratio vs. midpoint conductance ratio, with a correlation coefficient $R^2=0.834$, again good correlation, far better than with MPV. Therefore, by either method chosen, midpoint conductance techniques correlate far more strongly with midpoint capacity, than MPV and should therefore be far more useful as a monitoring technique. A high degree of correlation of midpoint conductance with midpoint capacity once again indicates the usefulness of midpoint conductance monitoring to predict cell state of health, without actually having to perform a discharge test. This avoids significant costs, scheduling difficulties and down time associated with performing capacity discharge testing.

In order to determine the absolute accuracy of conductance monitoring techniques, each of the five strings was analyzed on a cell by cell capacity/conductance basis. The results were subjected to regression analysis, the 80% pass/fail values of conductance calculated and each string analyzed cell by cell to determine the accuracy of the conductance value in predicting cell pass/fail results, using the box score technique of previous publications.

From this data, the single cell accuracy determinations were made, i.e.: what percent of good plus bad cells were correctly identified; what percent of bad cells were correctly identified; what percent of bad cells were missed and incorrectly called good; and what percent of good cells were incorrectly called bad by the conductance measurements.

Figure 9:
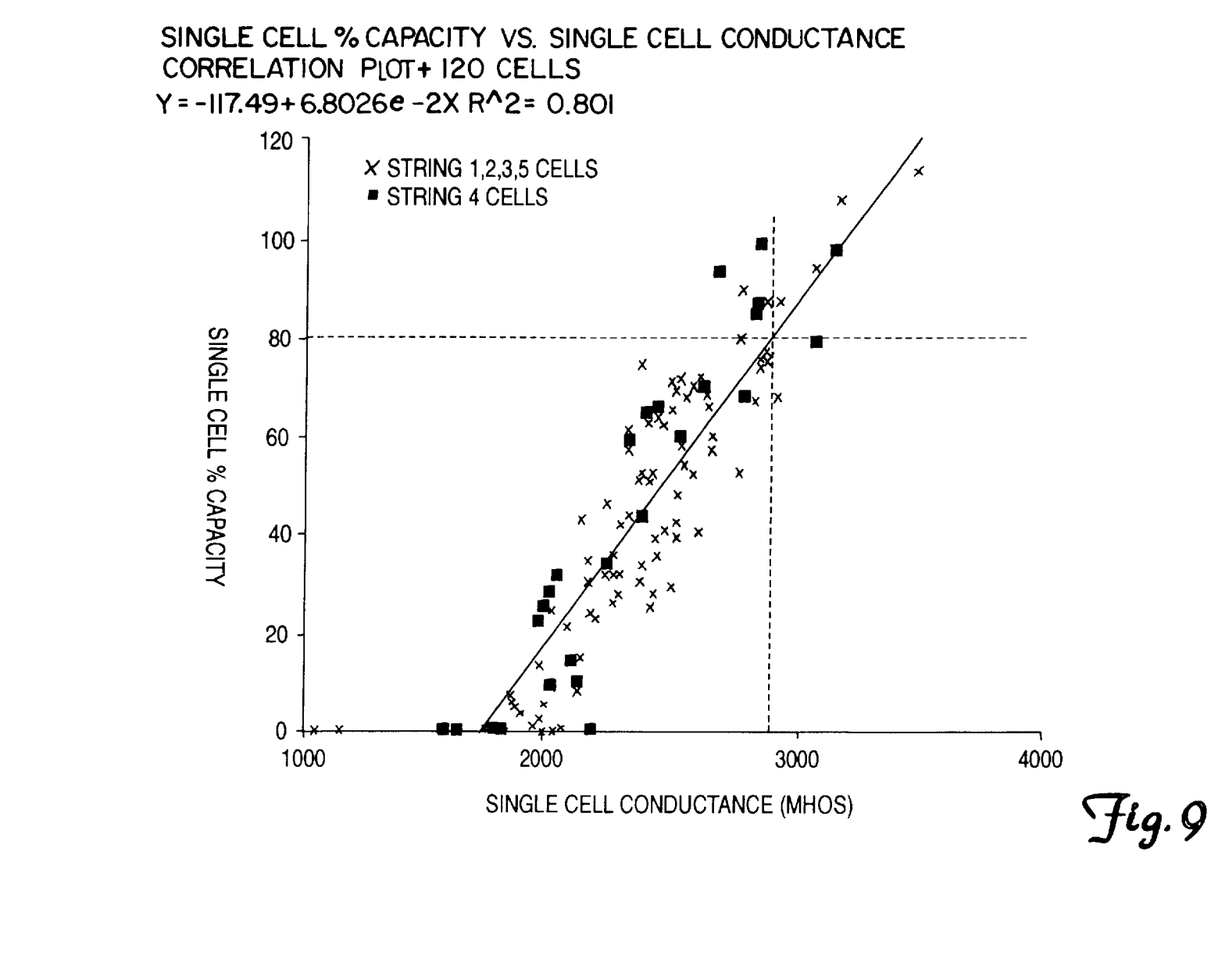
FIG. 9 is a graph of cell capacity versus cell conductance.
Figure 10:
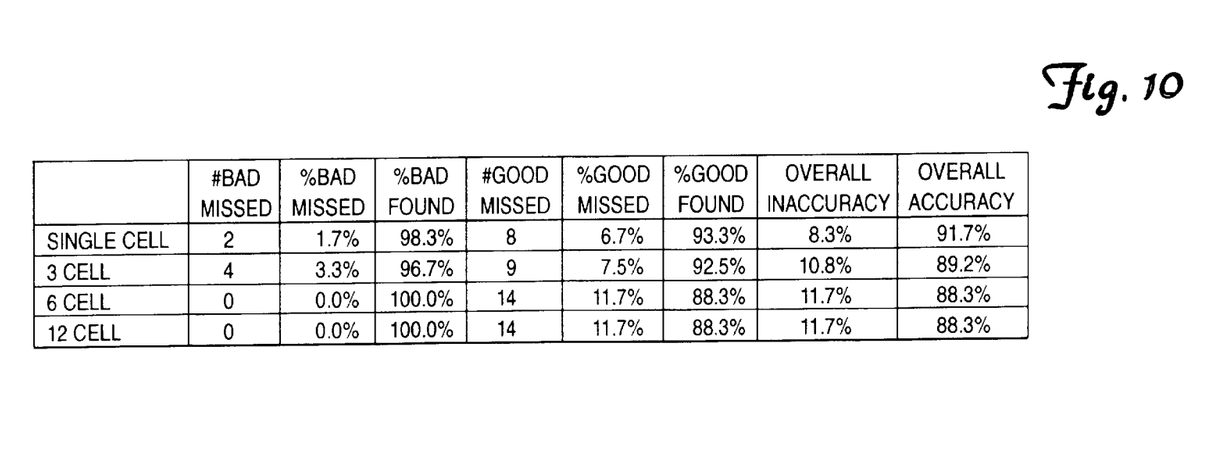
FIG. 10 is a table showing accuracy of a battery test.

FIG. 9 shows an overall correlation plot of single cell percent capacity vs. single cell conductance, the $R^2$ value of 0.801 indicating good correlation overall. The intersection of 80% capacity with the regression line was calculated, in order to determine the equivalent conductance value and establish the box score coordinates. For single cells, the plot shows an overall accuracy (good called good plus bad called bad) of 110/120=91.7%. Conductance measured two cells as good which were actually at 70% and 79% capacity. It also measured eight cells as bad (9% below the 80% capacity/conductance value) which were actually good. These values are shown in the table of FIG. 10 in the line entitled single cell.

Figure 11:
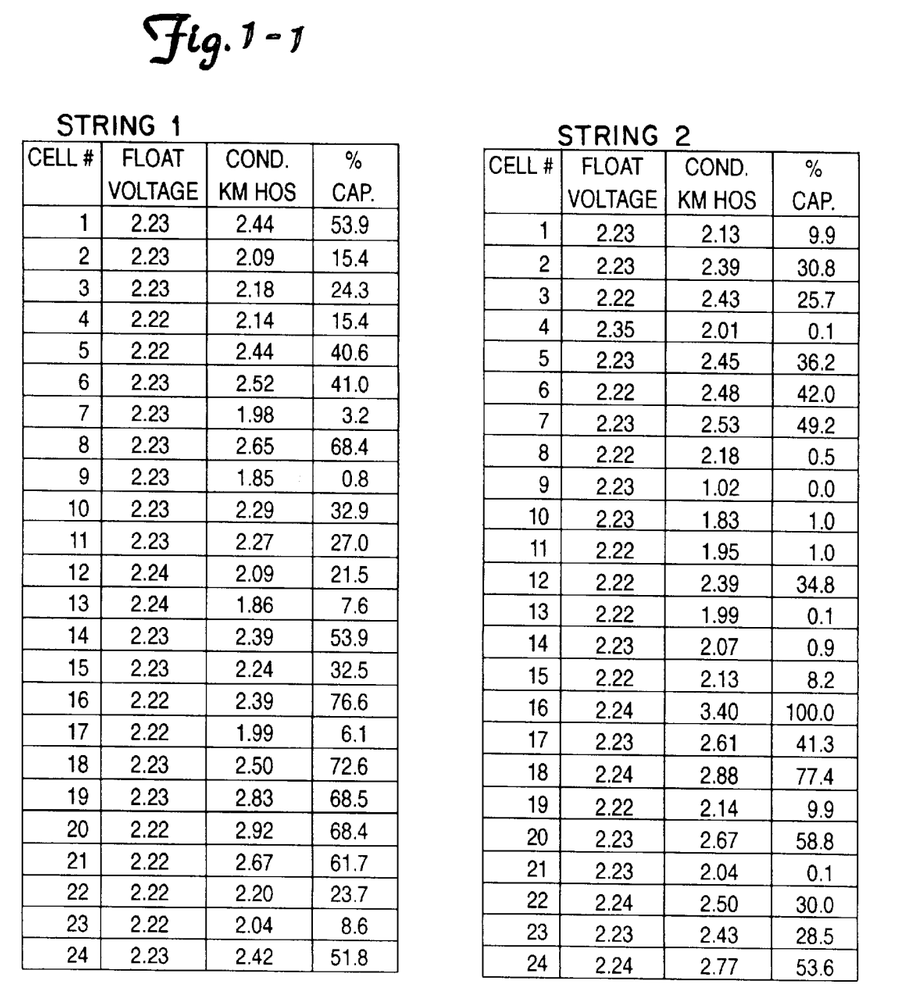
FIG. 11 is a graph of cell percent capacity versus cell conductance.

FIG. 11 shows the overall data combined into six cell monobloc conductance and capacity values. Again, regression analysis indicates good correlation, $R^2=0.853$. FIG. 11 indicates that, viewed only as six cell monoblocs only one good monobloc (in string 4) is indicated as bad by conductance, while all bad monoblocs are correctly identified by conductance. The reason for the erroneous conductance listing of string 4 can easily be understood, if one returns to the single cell plot (FIG. 9), where five of the cells listed as bad by conductance are from string 4. The same procedures, used for the other six cell monoblocs results in the overall data of table 3 for six cells, i.e., zero bad cells missed by conductance, 14 good cells erroneously listed as bad conductance.

Figure 12:
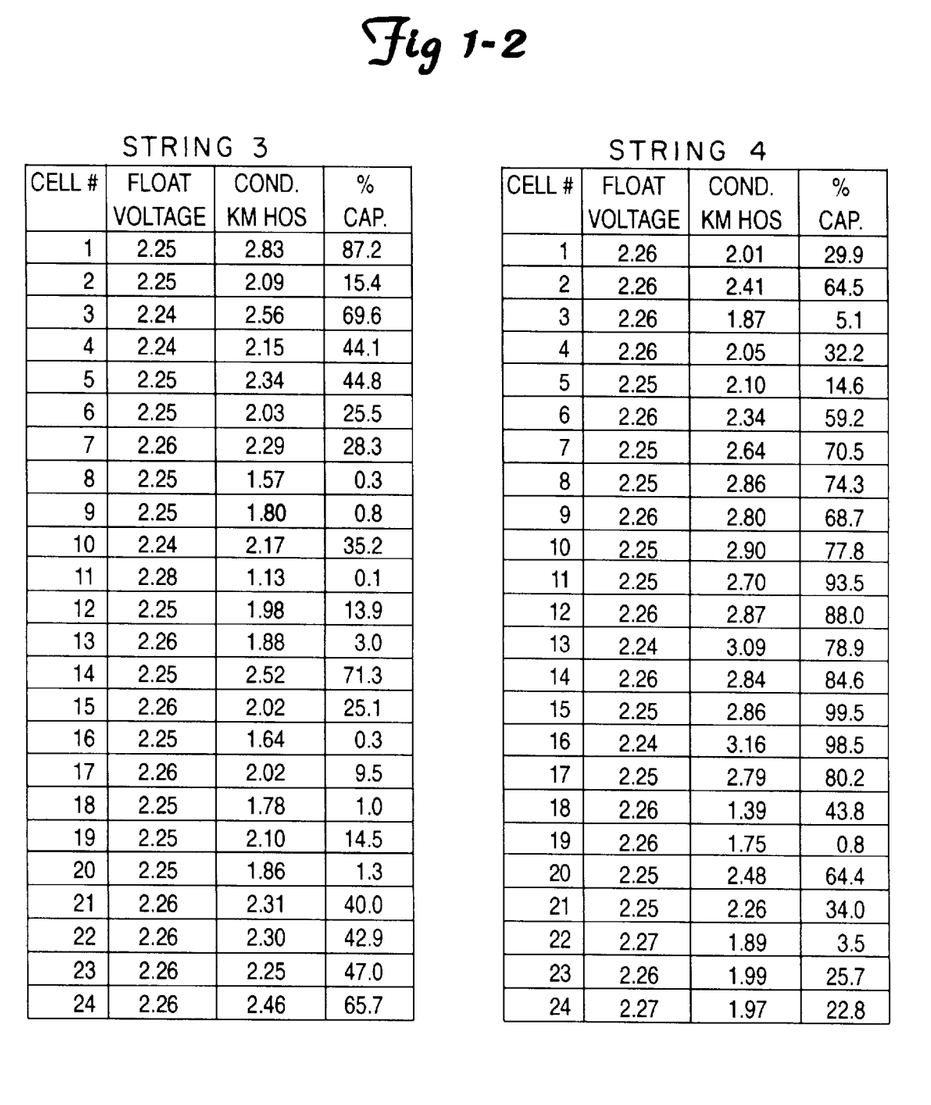
FIG. 12 is a graph of cell percent capacity versus cell conductance.

A similar correlation plot is shown in FIG. 12 for the data calculated as 12-cell monoblocs, with an $R^2$ of 0.708. FIG. 12 indicates all twelve cell monoblocs failed both conductance and capacity criteria, with no erroneous monobloc classifications. However, again using string 4 as an example on a single cell basis, the same five cells from string 4 are listed by conductance as bad when in fact they are good when measured as single cells as shown in FIG. 9. Considering all ten 12-cell monoblocs a total of 14 good cells have been listed as bad by conductance when included in the overall monobloc group. These values are shown on the 12-cell line of FIG. 10. The same procedures were used for each string in blocks of 3 cells, 6 cells and 12 cells and accuracy compared to the actual single cell values. The results are shown in FIG. 10. Accuracies of conductance in correctly detecting bad cells range from 96% to 100% from single cell through 3 and 6 cell to 12 cell blocks. Overall accuracy of conductance correctly detecting good cells ranges from 93.3% for single cells to 88.3% for 12 cells blocks. Total overall accuracies, taking all erroneous values into account (good called bad, bad called good) indicate that conductance can accurately detect from 88.3% to 91.7% of cells with both good or bad capacities. Even when used in twelve cell blocks (i.e. a 24 volt monitor), conductance showed an overall accuracy of 88.3% or an overall inaccuracy of 11.7%. It should be noted that the overall inaccuracy of 11.7% was composed entirely of good cells called bad. Perhaps more important is that the 12 cell grouping showed 0% bad cells missed using the 6 to 12 cell conductance measurement technique in the overall 120 cell population.

As this analysis shows, the ability to monitor the conductance of individual cells provides the highest level of information and therefore represents the most informative data possible about the condition of the battery. The individual cell resolution understandably increases installation cost and design complexity and therefore the associated monitoring system cost per string is much higher. Conversely, these data demonstrate how a much less complex and less expensive approach for monitoring 6 cell blocks or even 12 cell blocks would provide a more cost effective approach and still maintain a high level of accuracy. When a problem appears as measured by the 6 or 12 cell technique the use of individual cell conductance measurements could be used to more accurately identify cell conditions within the 6 to 12 cell groups. These results for 3, 6, and 12 cell monoblocs are dependent on the actual arrangement of the cells in these strings as found. Therefore the results can not be quantitatively extrapolated to all possible cell/monobloc or string arrangements.

In one embodiment, instead of measuring a 12-volt block of cells in a series of battery cells and comparing the result of the measurement to a standard, the present invention compares a battery conductance of one-half of a 48-volt battery system (i.e., 24 volts) to a second half of the series battery system. The results of the two tests are then compared. If the two tests differ by a predetermined percentage, an alarm or other warning is provided to indicate failure of the battery string. Further, the specific results of the test as well as the relative percentages can also be displayed, stored or otherwise acted upon.

One aspect of the invention includes the recognition that as a string of batteries ages, the difference in battery conductance between various portions of the string increases. While this aspect of the invention does not pinpoint the exact cell or block of cells which has caused a problem, that information can be obtained through further battery testing once an alarm has been provided. The invention is particularly useful for on-line monitoring.

The comparison between blocks of cells can be implemented as follows:

$$G1/G2 > K \quad \text{Equation 1A}$$

or $$|G1-G2| > K \quad \text{Equation 1B}$$

In this formula, G1 is the conductance of the first of one 24-volt half of a 48-volt series string, and G2 is the conductance for the second 24-volt string. Further, K is the maximum percentage ratio which is permitted before an alarm is provided. In one embodiment, this may be ten percent.

Figure 13:
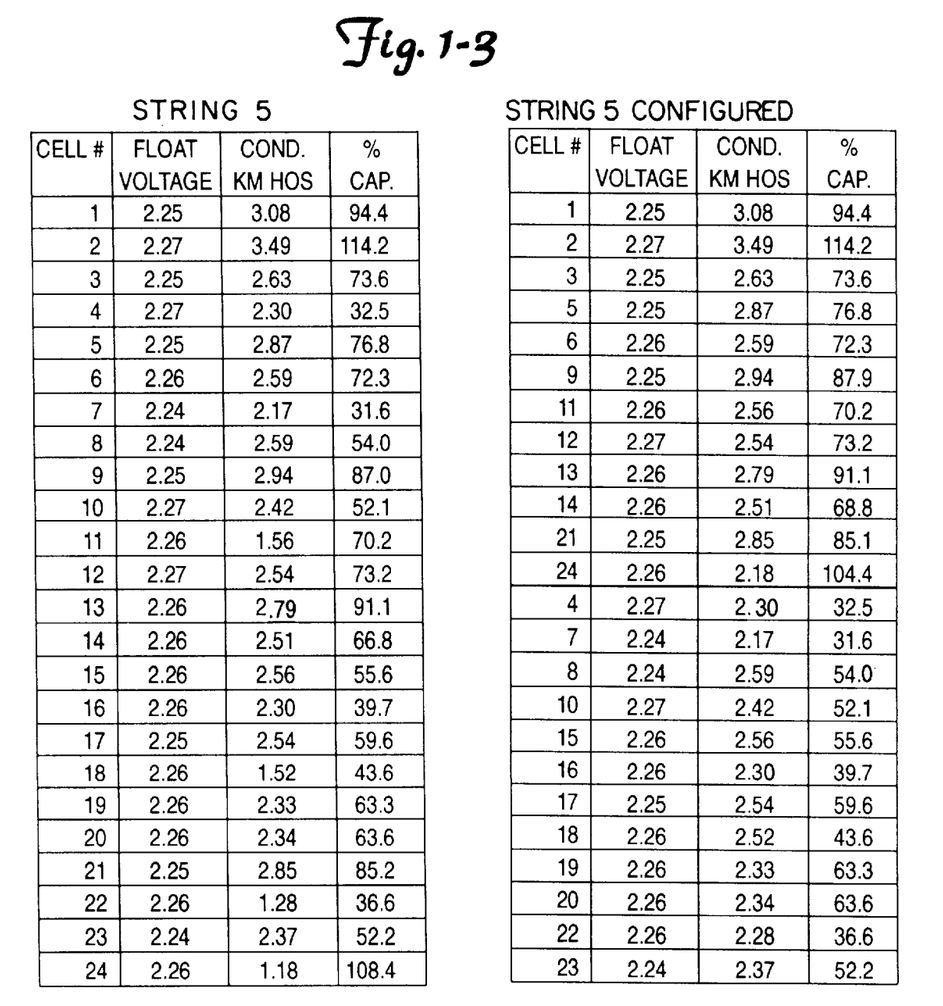
FIG. 13 is a simplified diagram of a device for testing a battery in accordance with one embodiment of the present invention.

FIG. 13 is a simplified block diagram of battery test circuitry 16 in accordance with the present invention. Apparatus 16 is shown coupled to battery 12 which includes a positive battery terminal 22, a midpoint terminal 23 and a negative battery terminal 24. Battery 12 is a storage battery having a plurality of individual cells, for example 24, and a fully charged voltage of 50.4 volts.

Circuitry 16 operates in accordance with one embodiment of the present invention and determines the conductances of battery 12 between terminals 22,23 and between terminals 23,24. Circuitry 16 includes current sources 50A,50B differential amplifiers 52A,52B, analog-to-digital converter 54 and microprocessor 56. Amplifiers 52A,52B are capacitively coupled to battery 12 through capacitors $C_1$, $C_2$ and $C_3$. Amplifiers 52A,52B have outputs connected to inputs of analog-to-digital converter 54. Microprocessor 56 is connected to system clock 58, memory 60, and analog-to-digital converter 54. Microprocessor 56 is also capable of receiving an input from input device 66.

In operation, current sources 50A,50B are controlled by microprocessor 56 and provide a current I in the direction shown by the arrows in FIG. 12. In one embodiment, this is a square wave or a pulse. Differential amplifiers 52A,52B are connected to terminals 22 and 23 and terminals 23 and 24, respectively, of battery 12 through capacitors $C_1$, $C_2$ and $C_3$ and provide outputs related to the voltage potential difference between the terminals. In a preferred embodiment, amplifiers 52A,52B have a high input impedance.

Circuitry 16 is connected to battery 12 through a four-point connection technique known as a Kelvin connection. This Kelvin connection allows currents I to be injected into battery 12 through a first pair of terminals while the voltage V across the terminals is measured by a second pair of connections. Because very little current flows through amplifiers 52A,52B, the voltage drop across the inputs to the amplifiers is substantially identical to the voltage drop across terminals of battery 12. The output of the differential amplifiers 52A,52B are converted to a digital format by A/D converter 54 and are provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. The microprocessor determines the change in battery voltage due to the current pulse I using amplifiers 52A, 52B and analog-to-digital converter 54. The value of current I generated by current sources 50A,50B are known and stored in memory 60. In one embodiment, currents I are obtained by applying a load to battery 12. Microprocessor 56 calculates the conductance of battery 12 using the following equation:

$$\text{Conductance} = G_{BAT} = \frac{\Delta I}{\Delta V} \quad \text{Equation 2}$$

where $\Delta I$ is the change in current flowing through battery 12 due to current sources 50A,50B and $\Delta V$ is the change in battery voltage due to applied current $\Delta I$.

Microprocessor 56 operates in accordance with the present invention and determines two conductances: $G_{BAT22,23}$ (the conductance between terminals 22 and 23) and $G_{BAT23,24}$ (the conductance between terminals 23 and 24). Microprocessor compares $G_{BAT22,23}$ with $G_{BAT23,24}$ in accordance with Equation 1 and provides a warning output 62 if the difference is more than a predetermined amount, for example, ten percent. This can be used to signal an operator to perform additional testing to determine the specific cause of the fault. The warning output 62 may be transmitted to a remote control station along with the specific results or other information. Input 66 is used to input information regarding battery 12, the test site, etc. and may be used to initiate testing.

The invention is also useful in detecting thermal runaway conditions which have been known to occur when charging a battery. A thermal runaway condition is a feedback condition in which a battery undergoing charge begins to heat in a manner which causes more charge to be drawn, thus causing further heating. Using the present invention, the onset of thermal runaway may be detected when ratio between the two conductances varies more than a predetermined amount and halted before damaging the battery. The invention is also advantageous because it does not require information regarding an initial condition of the battery.

The present invention is applicable to any type of battery test. However, in one preferred embodiment, a conductance based battery test is provided. The conductance measurement may be obtained through any appropriate technique and is not limited to the specific embodiments set forth herein. Other types of battery testing may be used including load testing, resistance or ohmic testing, or impedance or reactance testing.

Those skilled in the art will recognize that the invention may be implemented in any appropriate means with additional features. For example, the invention may be implemented using other battery tests than those enumerated above. The particular comparison may also be changed and is not limited to those set forth in Equation 1. Further, the particular string of batteries need not be divided in half to perform the test, and other permutations are within the scope of the invention. More than two strings may also be used and a more elaborate comparison technique implemented such as comparison against some or all of the other strings. More elaborate comparisons may be used such as statistical and/or chronological comparisons. The testing of string portions may also overlap such that some cells may be in more than one string portion. The testing may be implemented using analog circuitry, software or their hybrid.

Although the present invention has been described with reference to preferred embodiments, workers skilled in the art will recognize that changes may be made in form and detail without departing from the spirit and scope of the invention.

What is claimed is:

1. A device for testing a battery, comprising:

circuitry adapted to measure a first conductance of a first portion of a string of highly conductive cells that make up the battery;

circuitry adapted to measure a second conductance of a second portion of the string of highly conductive cells that make up the battery; and circuitry adapted to compare the first conductance and second conductance and provide an output based upon the comparison which is related to a condition of the battery.

2. The device of claim 1 wherein the comparison comprises a ratio of the first conductance and the second conductance.

3. The device of claim 2 wherein a warning output is provided if a difference between the first conductance and the second conductance is more than about 10%.

4. The device of claim 1 wherein the comparison comprises a subtraction of the conductances.

5. The device of claim 1 wherein the first portion of the battery has the same number of cells as the second portion.

6. The device of claim 1 wherein the circuits adapted to measure conductance include a current generator and voltage measurement circuitry.

7. The device of claim 1 wherein the circuits adapted to measure conductance are coupled to the battery through Kelvin connections.

8. The device of claim 1 wherein the output provides an indication of a thermal runaway condition during charging.

9. The device of claim 1 wherein the circuitry adapted to compare includes a microprocessor.

* * * * *